(12) United States Patent
Chao et al.

(10) Patent No.: US 9,159,871 B2
(45) Date of Patent: Oct. 13, 2015

(54) LIGHT-EMITTING DEVICE HAVING A REFLECTIVE STRUCTURE AND A METAL MESA AND THE MANUFACTURING METHOD THEREOF

(71) Applicant: Epistar Corporation, Hsinchu (TW)

(72) Inventors: Kuang-Ping Chao, Hsinchu (TW); Wen-Luh Liao, Hsinchu (TW); Fu-Chun Tsai, Hsinchu (TW); Shih-I Chen, Hsinchu (TW); Chia-Liang Hsu, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

(21) Appl. No.: 14/153,733

(22) Filed: Jan. 13, 2014

(65) Prior Publication Data
US 2015/0200331 A1 Jul. 16, 2015

(51) Int. Cl.
| H01L 33/00 | (2010.01) |
| H01L 33/60 | (2010.01) |
| H01L 33/62 | (2010.01) |
| H01L 33/38 | (2010.01) |

(52) U.S. Cl.
CPC ............ *H01L 33/0079* (2013.01); *H01L 33/38* (2013.01); *H01L 33/60* (2013.01); *H01L 33/62* (2013.01); *H01L 2933/0016* (2013.01); *H01L 2933/0058* (2013.01); *H01L 2933/0066* (2013.01)

(58) Field of Classification Search
CPC ........................................................ H01L 33/62
USPC ............................................... 257/79; 438/28
See application file for complete search history.

(56) References Cited

U.S. PATENT DOCUMENTS

2003/0189212 A1* 10/2003 Yoo .................................. 257/79
2012/0235167 A1* 9/2012 Odnoblyudov ................. 257/88

* cited by examiner

*Primary Examiner* — Selim Ahmed
*Assistant Examiner* — Changyun Yi
(74) *Attorney, Agent, or Firm* — Ditthavong & Steiner, P.C.

(57) ABSTRACT

A manufacturing method of a light-emitting device is disclosed. The method provides for patterning a semiconductor stack on a first substrate in order to form multiple light-emitting mesas. A second substrate is then bonded to the multiple light-emitting mesas and a reflective structure is formed on the first substrate. A metal layer is then applied on the reflective structure and the metal layer is patterned to form multiple metal mesas corresponding to the multiple light-emitting mesas, with a portion of the reflective structure being exposed.

20 Claims, 8 Drawing Sheets

LIGHT-EMITTING DEVICE HAVING A REFLECTIVE STRUCTURE AND A METAL MESA AND THE MANUFACTURING METHOD THEREOF

TECHNICAL FIELD

The application relates to a light-emitting device and the manufacturing method thereof, and more particularly, to a light-emitting device having a reflective structure and a metal mesa, and the manufacturing method thereof.

DESCRIPTION OF BACKGROUND ART

Figure 1:
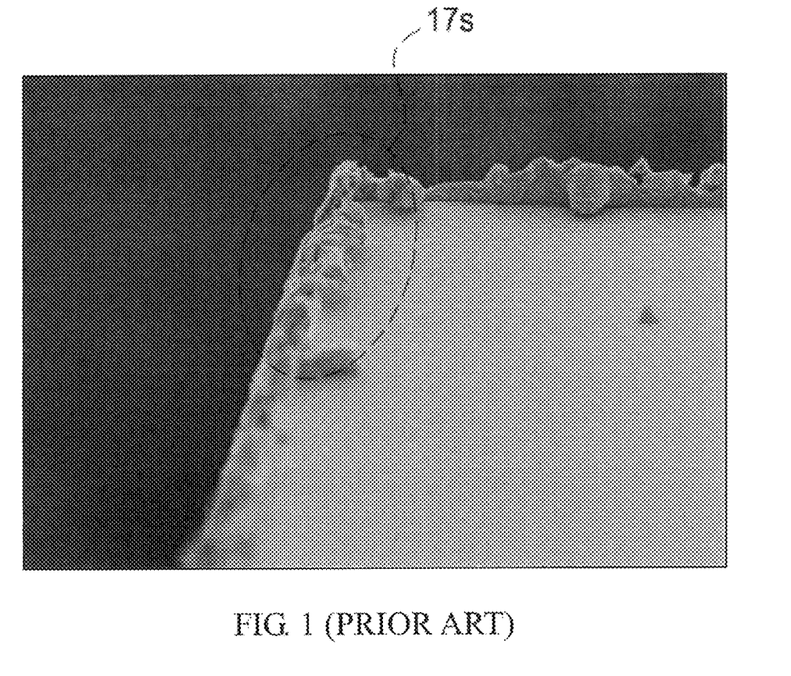
FIG. 1 illustrates an SEM view of a volcano defect on a conventional optoelectronic device.
Figure 2:
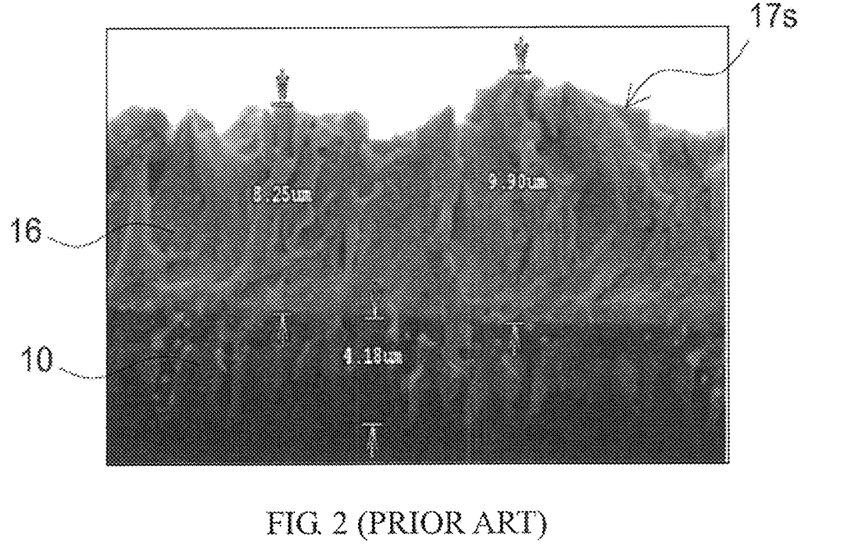
FIG. 2 illustrates an SEM view of a volcano defect on a conventional optoelectronic device.

Due to some superior physical properties of AuSn alloy, such as low melting point and good ductility, AuSn alloy has been applied in semiconductor and other industries for years, and gradually becomes one of the preferred materials for soldering in optoelectronic device package. The melting point of AuSn alloy is below 280° C., which benefits for solder bond in optoelectronic device package application. But during laser dicing of the optoelectronic device, the operating temperature of laser is often higher than 1000° C., which conflicts with the low melting point and the good ductility of AuSn alloy, and a volcano defect 17s shown in FIG. 1 and FIG. 2 forms on AuSn alloy 16 when AuSn alloy 16 is formed on an optoelectronic device 10 after laser dicing. The volcano defect 17s makes the optoelectronic device 10 not being able to be mounted on a package board with good reliability.

SUMMARY OF THE APPLICATION

A manufacturing method of a light-emitting device comprises providing a first substrate; forming a semiconductor stack on the first substrate; patterning the semiconductor stack to form multiple light-emitting mesas; bonding a second substrate to the multiple light-emitting mesas; forming a reflective structure on the first substrate; applying a metal layer on the reflective structure; and patterning the metal layer to form multiple metal mesas corresponding to the multiple light-emitting mesas and exposing a portion of the reflective structure.

DETAILED DESCRIPTION OF PREFERRED EMBODIMENTS

The embodiment of the application is illustrated in detail, and is plotted in the drawings. The same or the similar part is illustrated in the drawings and the specification with the same number.

Figure 3A:
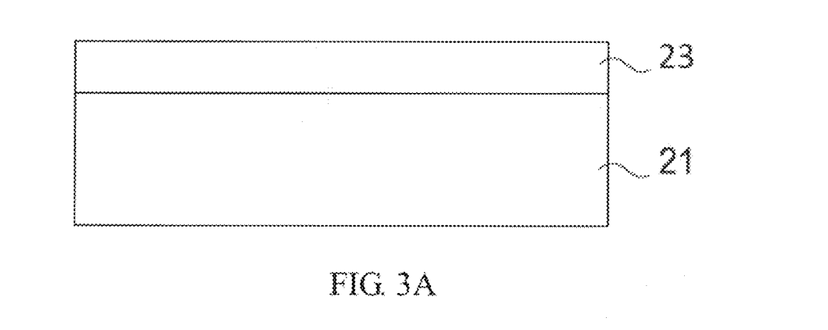
FIGS. 3A-3J illustrate a manufacturing method of a light-emitting device in accordance with an embodiment of the present application.

FIGS. 3A-3J illustrate a manufacturing method of a light-emitting device in accordance with an embodiment of the present application. As shown in FIG. 3A, a semiconductor stack 23 is grown on a growth substrate 21. The material of the semiconductor stack 23 comprises III-V group material, such as GaP or AlGaInP, which is doped with p-type dopant or n-type dopant. The material of the growth substrate 21 preferably is lattice matched to that of the semiconductor stack 23. The semiconductor stack 23 comprises a first semiconductor layer having a first conductivity type, such as n-type, a second semiconductor layer having a second conductivity type different from the first conductivity type, such as p-type, and an active layer formed between the first semiconductor layer and the second semiconductor layer. The active layer comprises a single heterostructure (SH), a double heterostructure (DH), or a multi-quantum well (MQW) structure. The semiconductor stack 23 may be formed on the growth substrate 21 by a known epitaxy method, such as metallic-organic chemical vapor deposition (MOCVD) method, a molecular beam epitaxy (MBE) method, or a hydride vapor phase epitaxy (HVPE) method.

Figure 3B:
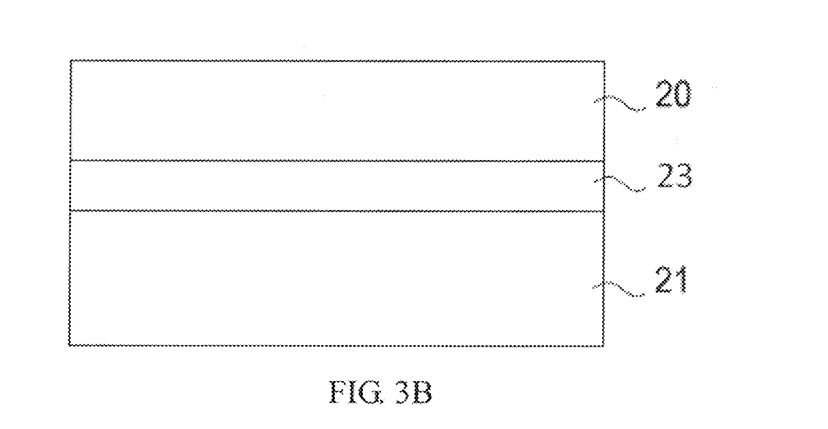

As shown in FIG. 3B, a permanent substrate 20 is bonded to the semiconductor stack 23 and opposite to the growth substrate 21. The permanent substrate 20 comprises conductive material, insulative material, or the combination thereof. Specifically, the permanent substrate 20 can be a conductive substrate, such as a silicon substrate, or an insulative substrate, such as a sapphire substrate. After the permanent substrate 20 is applied to the semiconductor stack 23, the growth substrate 21 can be removed by chemical etch or physical polish.

In the following description of the embodiment, the permanent substrate 20 is illustrated as an insulative substrate, such as a sapphire substrate, but this is only for illustration, and is not intended to limit the scope of the application. A plurality of scribe lines 22a can be formed in a grid pattern on the semiconductor stack 23 of FIG. 3B, wherein the semiconductor stack 23 is patterned by the plurality of scribe lines 22a to form multiple light-emitting mesas 22. A pair of electrodes (not shown) can be formed on each light-emitting mesa 22. In an example of the embodiment, the pair of electrodes (not shown) can be formed on the same side of the light-emitting mesa 22 when the permanent substrate 20 is an insulative substrate. In another example of the embodiment, the pair of electrodes (not shown) can be formed on opposite sides of the light-emitting mesa 22 when the permanent substrate 20 is a conductive substrate.

Figure 3C:
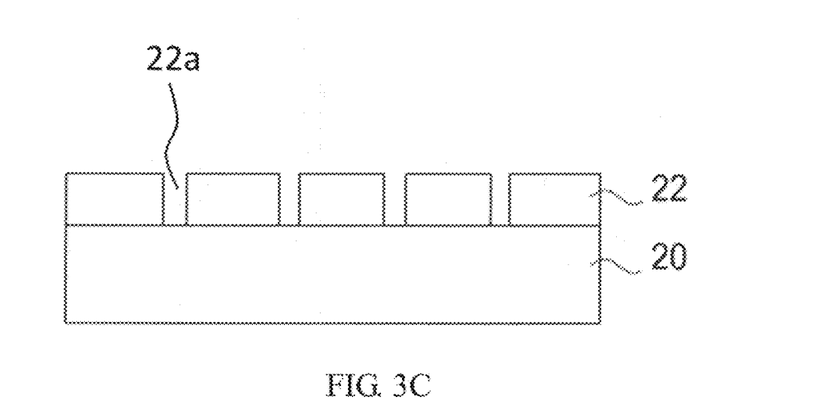

The thermal conductivity of the sapphire is low, and is not sufficient to release the heat generated in the light-emitting device to the outside environment when the light-emitting device is energized. As shown in FIG. 3C, after the multiple light-emitting mesas 22 and/or the pair of electrodes (not shown) is formed, the permanent substrate 20 can be polished to 60 μm to 150 μm in thickness, preferably 85 μm to 120 μm in thickness, which helps to release the heat generated in the light-emitting device to the outside environment.

Figure 3D:
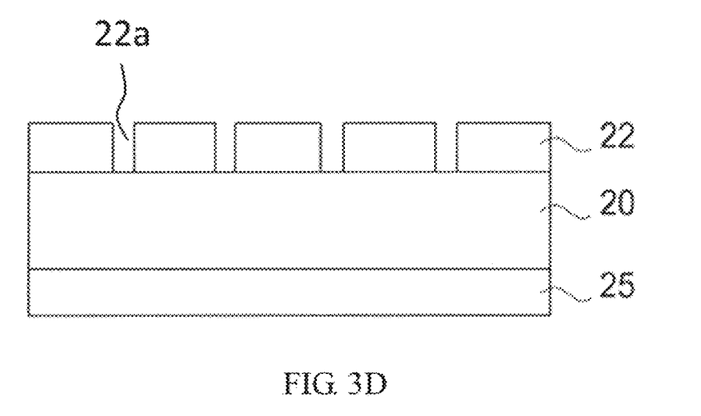

As shown in FIG. 3D, a reflective structure 25 can be formed on a bottom surface of the permanent substrate 20 opposite to the multiple light-emitting mesas 22. The reflective structure 25 substantially covers the whole bottom surface of the permanent substrate 20, which increases the light extraction efficiency of the light-emitting device. The reflective structure 25 reflects a light which is emitted from the active layer and towards the permanent substrate 20. In an example of the embodiment, the reflective structure 25 comprises a reflective portion comprising dielectric material, metal material, or the combination thereof. The reflective portion can be a single layer or a stack. If the reflective portion comprises dielectric material and is a stack, the reflective portion can be a DBR stack comprising a high refractive index layer and a low refractive index layer stacked alternately, such as $SiO_2/TiO_2/SiO_2/TiO_2/SiO_2$. In order to increase the reflectivity of the reflective portion, the reflective portion further comprises metal material, wherein the metal material comprises a reflectivity higher than 80% at visible light wavelength, preferably higher than 90% at visible light wavelength, such as Ag or Al. For example, the reflective portion can be $SiO_2/TiO_2/SiO_2/TiO_2/SiO_2/Al$.

The reflective structure 25 further comprises a barrier portion comprising a metal stack formed under the reflective portion. The material of the metal stack comprises Ti, Pt, Ni, Au, or the combination thereof, such as Ti/Pt/Au/Ti/Ni/Au, which protects the reflective portion of the reflective structure 25 from being damaged or contaminated that may affect the reflectivity of the reflective portion of the reflective structure 25.

It is noted that if the reflective portion comprises a combination of the dielectric material and metal material, the metal material of the reflective portion is positioned between the dielectric material of the reflective portion and the metal material of the barrier portion.

Figure 3E:
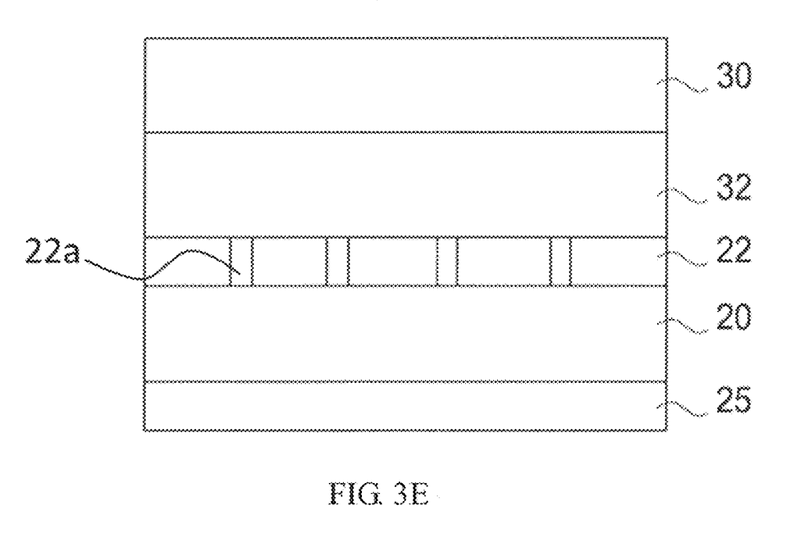

As shown in FIG. 3E, a temporary substrate 30 can be bonded to the multiple light-emitting mesas 22 through an adhesive material 32 which has a bonding force larger than 0.2 N/mm before thermal treatment and smaller than 0.02 N/mm after the thermal treatment.

Figure 3F:
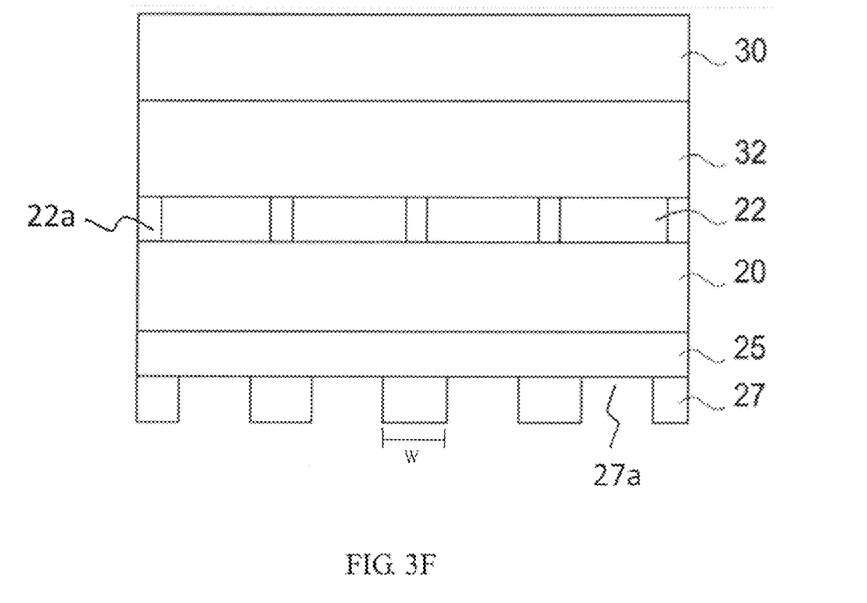

As shown in FIG. 3F, after bonding the temporary substrate 30 to the multiple light-emitting mesas 22, multiple resist patterns 27 can be formed on the reflective structure 25 by photolithography, wherein the multiple resist patterns 27 are spaced apart by multiple openings 27a. A position where the resist pattern 27 is formed on is corresponding to the position of the scribe line 22a. A width W of the resist pattern 27 is larger than that of the scribe line 22a.

Figure 3G:
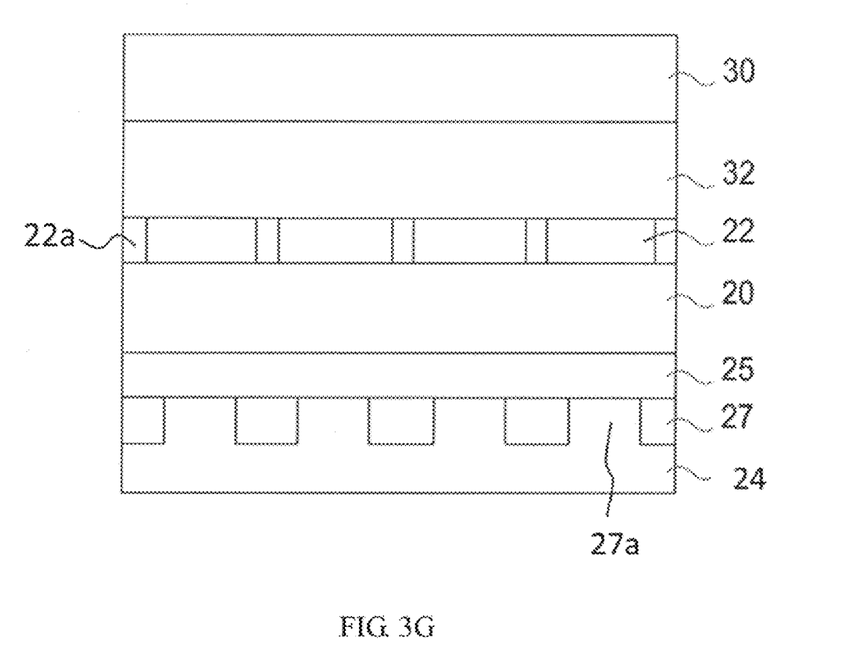

As shown in FIG. 3G, a metal layer 24 is formed on the resist pattern 27 and filled into the multiple openings 27a. The metal layer 24 can be formed by a physical deposition process or a chemical deposition process. The deposition temperature of the metal layer 24 is lower than a peeling temperature of the adhesive material layer 32, such as lower than 150° C. The material of the metal layer 24 comprises metal, or metal alloy containing a transition metal and a group WA element, such as AuSn. The thermal conductivity of the metal layer 24 is preferably higher than 35 W/(m·K), which helps to release the heat generated in the light-emitting device to the outside environment when the light-emitting device is energized. The melting point of the metal layer 24 is preferably low, such as below 350° C., which helps to solder bond the light-emitting device to a package substrate, such as PCB board or a FR4 substrate. In another aspect, the low melting point of the metal layer 24 protects the ohmic contact of the pair of electrodes previously formed on the light-emitting mesa 22 from being damaged. The metal layer 24 can be a single layer, such as an AuSn layer, or a multi-layer structure alternately stacked by metal, metal alloy or the combination thereof, such as AuSn/Sn/AuSn/Sn/AuSn. The ratio of Au and Sn affects the melting point of AuSn. For example, when the ratio of Au and Sn is 80:20, the melting point of AuSn is about 300° C. If the Sn percentage of AuSn increases, the melting point of AuSn increases accordingly.

Figure 3H:
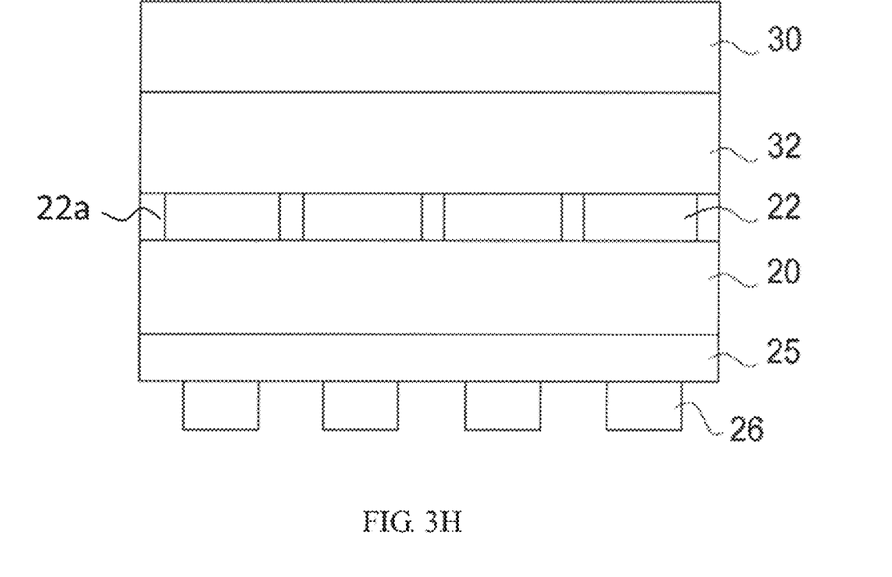

As shown in FIG. 3H, after the multiple resist patterns 27 are removed by etch or lift-off, the metal layer 24 is patterned to form multiple metal mesas 26 with a regular pattern on the reflective structure 25, wherein a position where the metal mesa 26 is formed on is corresponding to each light-emitting mesa 22, wherein the multiple metal mesas 26 are separated from each other by a space larger than a space between adjacent two light-emitting mesas 22, in other words, the multiple metal mesas 26 are separated from each other by a space larger than a width of the scribe line 22a. A surface area of each metal mesa 26 is larger than the total area of each pair of the electrodes formed on the light-emitting mesa 22.

Figure 3I:
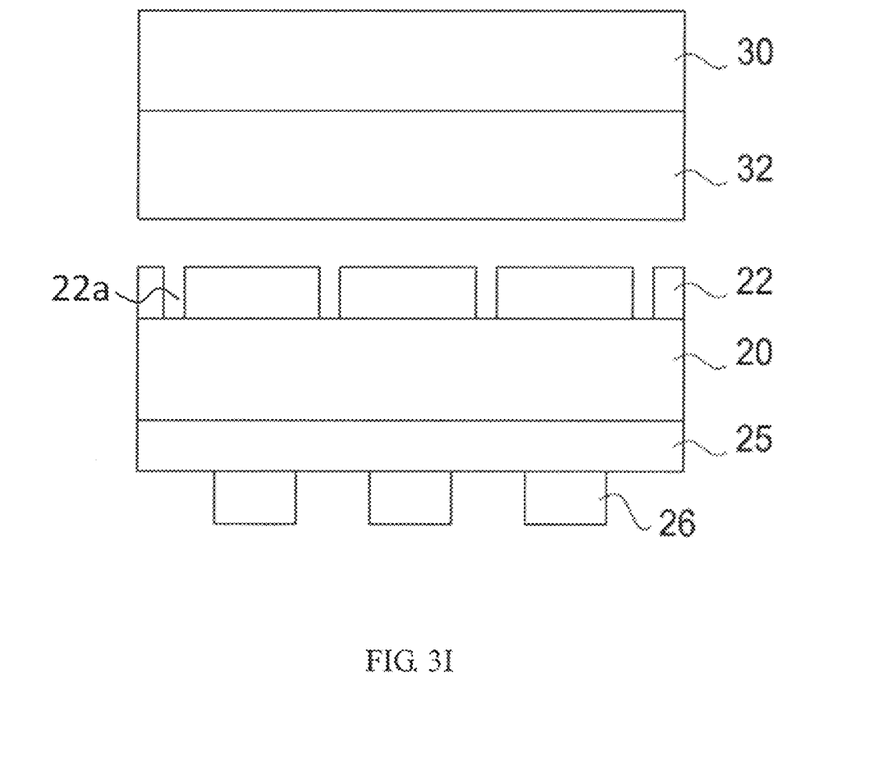

As shown in FIG. 3I, the temporary substrate 30 with the adhesive material 32 formed thereon is removed by performing a thermal treatment under a treatment temperature above the peeling temperature of the adhesive material layer 32, such as above 150° C. to weaken a bonding force between the plurality of light-emitting mesas 22 and the adhesive material 32. As described above, the bonding force of the adhesive material 32 is larger than 0.2 N/mm before thermal treatment, but the bonding force decrease after thermal treatment, the temporary substrate 30 with the adhesive material 32 formed thereon can be peeled off from the plurality of light-emitting mesas 22 after thermal treatment.

Figure 3J:
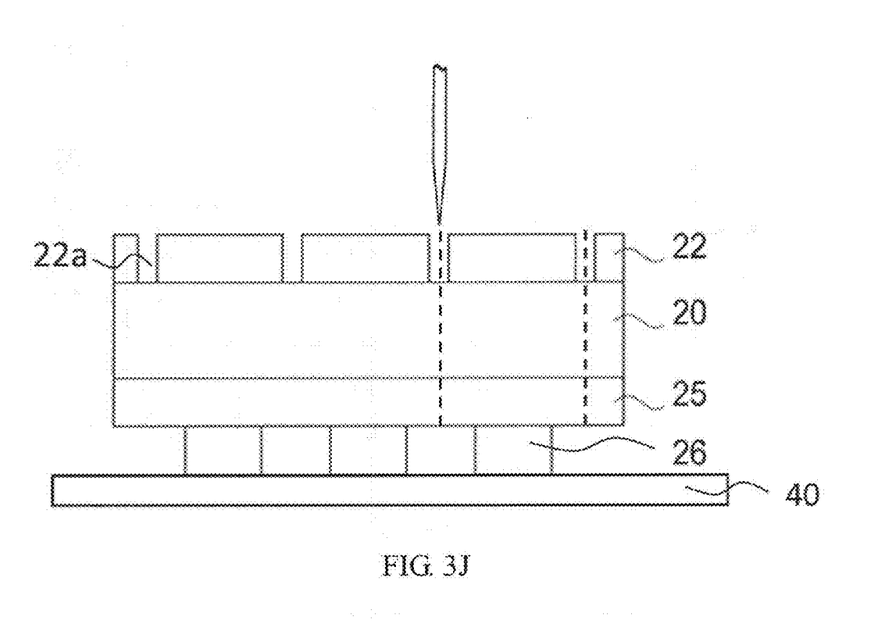

As shown in FIG. 3J, an adhesive substrate 40, such as a blue tape or an UV tape, is attached to the multiple metal mesas 26 after removing the temporary substrate 30, wherein the multiple light-emitting mesas 22 is separated into multiple light-emitting dies by dividing the permanent substrate 20 and the reflective structure 25 along predetermined scribe lines 22a. In an example of the embodiment, the light-emitting die comprises a light-emitting diode (LED). The step of separating the multiple light-emitting mesas 22 into multiple light-emitting dies comprises laser scribing, blade sawing, or the combination thereof. Preferably, laser scribing is performed along the plurality of scribe lines 22a, which is formed on a front side of the permanent substrate 20, and penetrated into the permanent substrate 20, for example 50% depth of the permanent substrate 20, then the multiple light-emitting mesas 22 is split into multiple light-emitting dies by blade sawing from a backside of the permanent substrate 20 opposite to the front side of the permanent substrate 20. During the separation, the surface of the metal mesa 26 is not touched, so the surface morphology of the metal mesa 26 is not affected by the laser scribing or the blade sawing.

Figure 4:
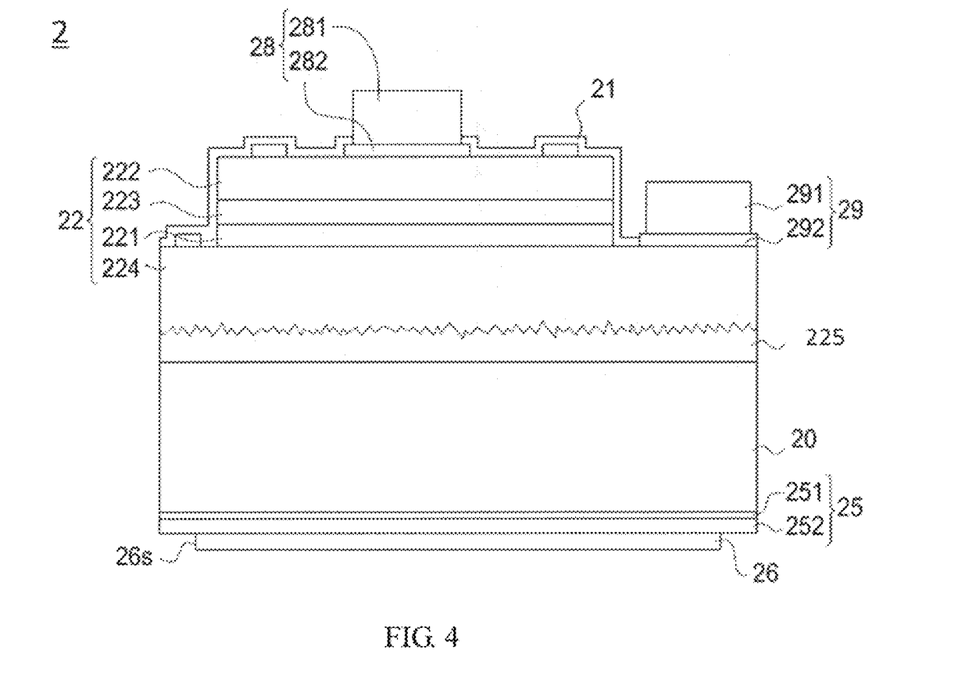
FIG. 4 illustrates a cross-sectional view of a light-emitting device in accordance with an embodiment of the present application.

FIG. 4 illustrates a cross-sectional view of a light-emitting device 2 manufactured with a method illustrated in FIGS. 3A-3J. The light-emitting device 2 comprises a permanent substrate 20; a light-emitting mesa 22 formed on the permanent substrate 20; a pair of electrodes, such as a first electrode 29 and a second electrode 28, formed on the light-emitting mesa 22. The material of the light-emitting mesa 22 comprises III-V group material, such as GaP or AlGaInP, which is doped with p-type dopant or n-type dopant. The light-emitting mesa 22 comprises a first semiconductor layer 221 having a first conductivity type, such as n-type, a second semiconductor layer 222 having a second conductivity type different from the first conductivity type, such as p-type, and an active layer 223 formed between the first semiconductor layer 221 and the second semiconductor layer 222. The active layer 223 comprises a single heterostructure (SH), a double heterostructure (DH), or a multi-quantum well (MQW) structure. The light-emitting mesa 22 may be formed by a known epitaxy method, such as metallic-organic chemical vapor deposition (MOCVD) method, a molecular beam epitaxy (MBE) method, or a hydride vapor phase epitaxy (HVPE) method. The electrons provided from the n-type semiconductor layer, such as the first semiconductor layer 221, and the holes provided from the p-type semiconductor layer, such as the second semiconductor layer 222, combine in the active layer 223 to emit a light under an external electrical current driving.

In an example of the embodiment, the light-emitting mesa 22 comprises a window layer 224 formed under the first semiconductor layer 221. The material of window layer 224 comprises III-V group material, such as GaP, or transparent conductive material, such as thin metal, or metal oxide, such as indium tin oxide (ITO) or indium zinc oxide (IZO). The window layer 224 helps to spread a current from one of the pair of electrodes, for example the first electrode 29, to the first semiconductor layer 221.

As shown in FIG. 4, the first electrode 29 and the second electrode 28 respectively comprises a bonding pad 291, 281 and a contact region 292, 282. The bonding pad 291 or 281 can be formed for wire bonding, and the contact region 292, 282 can be formed to reduce the ohmic contact resistance between the electrode and the light-emitting mesa 22.

A protective layer 21 covers on the light-emitting mesa 22 to insulate the first electrode 29 and the second semiconductor layer 222 to avoid a short circuit, or to protect the surface of the active layer 223 from being damaged by, such as moisture or oxidation. The material of the protective layer 21 comprises insulative material such as oxides, nitrides, or the combination thereof.

A bonding layer 225 can be formed between the light-emitting mesa 22 and the permanent substrate 20. The bonding layer 225 increases the bonding force between the light-emitting mesa 22 and the permanent substrate 20. In order to increase the light extraction efficiency of the light-emitting device 2, a surface of the light-emitting mesa 22 adjacent to the bonding layer 225 can be roughed by etching, polishing or printing. The material of the bonding layer 225 comprises organic material, inorganic material, metal material or the combination thereof. The organic material comprises benzo-cyclo-butene (BCB), epoxy, or silicone. The inorganic material comprises oxides, nitrides, oxy-nitrides, metal oxides, such as $TiO_2$, $Ti_2O_5$, $Ta_2O_3$, ZnO, $Al_2O_3$, ITO, AZO or IZO, or semiconductor materials.

As shown in FIG. 4, the reflective structure 25 is formed on a bottom surface of the permanent substrate 20 opposite to the light-emitting mesas 22. The reflective structure 25 comprises the reflective portion 251, the barrier portion 252, or the combination thereof.

The reflective structure 25 substantially covers the whole bottom surface of the permanent substrate 20, which increases the light extraction efficiency of the light-emitting device 2. Specifically, the reflective structure 25 covers 90% above of the bottom surface of the permanent substrate 20. The bottom surface area difference between the reflective structure 25 and the permanent substrate 20 is smaller than 10%.

The metal mesa 26 is formed on a part of the reflective structure 25, preferably a center part of the reflective structure 25, wherein the bottom surface of the reflective structure 25 is larger than that of the metal mesa 26. A portion, such as a periphery area of the bottom surface of the reflective structure 25 is exposed and not covered by the metal mesa 26. A bottom surface area of the metal mesa 26 is larger than a top surface of the pair of the electrodes 28, 29. The structure of the metal mesa 26 having a smaller size than the reflective structure 25 has benefit to avoid of a volcano defect when the light-emitting device 2 is diced with laser scribing. A sidewall 26s of the metal mesa 26 is smooth.

The reflective portion 251 of the reflective structure 25 reflects a light which is emitted from the active layer 223 and towards the permanent substrate 20. The barrier portion 252 of the reflective structure 25 protects the reflective portion 251 from being damaged or contaminated, which may affect the reflectivity of the reflective portion of the reflective structure 25. Specifically, the barrier portion 252 is positioned between the reflective portion 251 and the metal mesa 26 to prevent the metal of the metal mesa 26 inter-diffusing into the reflective portion 251.

Figure 5:
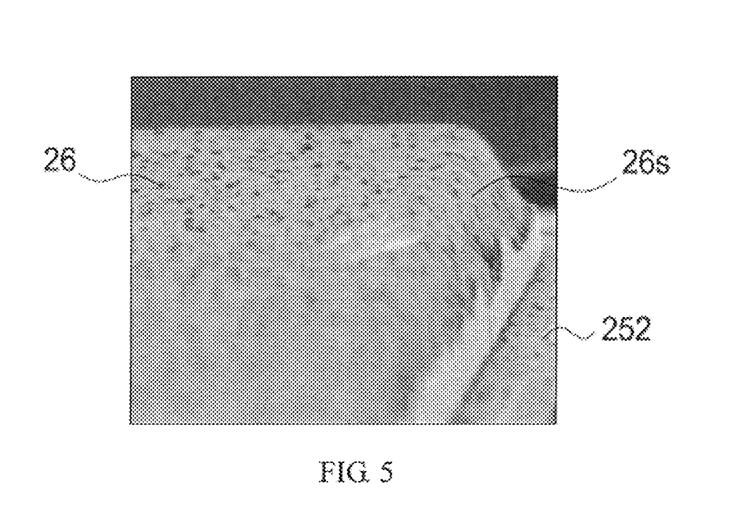
FIG. 5 illustrates an SEM view of a partial enlargement of a light-emitting device in accordance with an embodiment of the present application.

FIG. 5 illustrates an SEM view of the metal mesa 26 of the light-emitting device 2. Because the periphery area of the metal structure 252 is exposed and is not covered by the metal mesa 26, a sidewall 26s of the metal mesa 26 is not affected by the operating temperature of the laser scribing and the volcano defect is avoided.

Figure 6:
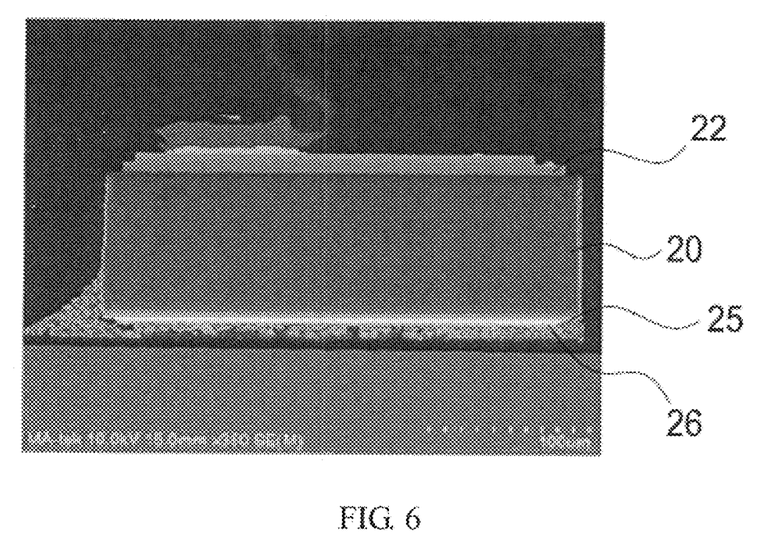
FIG. 6 illustrates an SEM view of a light-emitting device in accordance with an embodiment of the present application.

FIG. 6 illustrates an SEM view of the light-emitting device 2. The permanent substrate 20 comprises a thickness about 100 μm and a vertical sidewall. And the metal mesa 26 with 3 μm in thickness is formed under the permanent substrate 20 to avoid the volcano defect.

The principle and the efficiency of the present application illustrated by the embodiments above are not the limitation of the application. Any person having ordinary skill in the art can modify or change the aforementioned embodiments. Therefore, the protection range of the rights in the application will be listed as the following claims.

What is claimed is:

1. A manufacturing method of a light-emitting device, comprising:
    providing a first substrate;
    forming a semiconductor stack on the first substrate;
    patterning the semiconductor stack to form multiple light-emitting mesas;
    bonding a second substrate to the multiple light-emitting mesas;
    forming a reflective structure on the rear surface of the first substrate;
    applying a metal layer on the reflective structure; and
    patterning the metal layer to form multiple metal mesas corresponding to the multiple light-emitting mesas and exposing a portion of the reflective structure.

2. The manufacturing method of claim 1, further comprising forming a pair of electrodes on each light-emitting mesa before bonding the second substrate to the multiple light-emitting mesas.

3. The manufacturing method of claim 2, wherein a surface area of one of the metal mesas is larger than the total area of the pair of the electrodes.

4. The manufacturing method of claim 1, further comprising removing the second substrate; and attaching an adhesive substrate on the multiple metal mesas after removing the second substrate.

5. The manufacturing method of claim 4, further comprising separating the multiple light-emitting mesas into multiple light-emitting dies by dividing the first substrate and the reflective structure along predetermined scribe lines after removing the second substrate.

6. The manufacturing method of claim 5, wherein a surface area of the reflective structure on each of the light-emitting mesas is 90% above that of the first substrate on each of the light-emitting mesas after separating the multiple light-emitting mesas into multiple light-emitting dies.

7. The manufacturing method of claim 5, wherein a surface area of the reflective structure of the light-emitting mesa is larger than that of the metal mesa.

8. The manufacturing method of claim 5, wherein the light-emitting die comprises a light-emitting diode.

9. The manufacturing method of claim 5, wherein the step of separating the multiple light-emitting mesas comprises laser scribing, blade sawing, or the combination thereof.

10. The manufacturing method of claim 1, wherein the multiple metal mesas are separated from each other by a space larger than a space between adjacent two light-emitting mesas.

11. The manufacturing method of claim 1, wherein the step of applying the second substrate to the semiconductor stack comprises providing an adhesive material; and bonding the second substrate to the multiple light-emitting mesas by the adhesive material.

12. The manufacturing method of claim 11, wherein the step of removing the second substrate comprises performing a thermal treatment under a treatment temperature above 150° C. to weaken a bonding force between the second substrate and the adhesive material.

13. The manufacturing method of claim 12, wherein the bonding force is larger than 0.2 N/mm before the thermal treatment and smaller than 0.02 N/mm after the thermal treatment.

14. The manufacturing method of claim 1, wherein the reflective structure comprises a reflective portion, and a barrier portion formed between the metal mesa and the reflective portion.

15. The manufacturing method of claim 1, wherein the metal layer is formed on the reflective portion by a physical deposition process or a chemical deposition process.

16. The manufacturing method of claim 1, wherein the metal mesa comprises an alloy containing a transition metal and a group WA element.

17. The manufacturing method of claim 1, wherein the metal mesa comprises gold, tin, or the combination thereof.

18. The manufacturing method of claim 1, wherein a melting point of the metal mesa is below 350° C.

19. The manufacturing method of claim 1, wherein the first substrate comprises an insulative material.

20. The manufacturing method of claim 1, further comprising growing the semiconductor stack on a growth substrate; removing the growth substrate after forming the semiconductor stack on the first substrate; and polishing the first substrate to 60 μm to 150 μm in thickness after removing the growth substrate.

* * * * *